United States Patent [19]
Clampitt

[11] Patent Number: 6,063,656
[45] Date of Patent: May 16, 2000

[54] CELL CAPACITORS, MEMORY CELLS, MEMORY ARRAYS, AND METHOD OF FABRICATION

[75] Inventor: Darwin A. Clampitt, Boise, Id.

[73] Assignee: Micron Technology, Inc., Boise, Id.

[21] Appl. No.: 08/844,512

[22] Filed: Apr. 18, 1997

[51] Int. Cl.[7] .................................................. H01L 21/00
[52] U.S. Cl. ........................ 438/239; 438/238; 438/197; 438/253; 438/255; 438/694; 438/700; 438/734; 438/396; 438/398; 257/306
[58] Field of Search ................................. 438/694, 734, 438/706, 704, 210, 238, 239, 396, 700, 197, 253, 255; 257/306, 296

[56] References Cited

U.S. PATENT DOCUMENTS

| | | | |
|---|---|---|---|
| 5,013,680 | 5/1991 | Lowrey et al. ........................ | 438/242 |
| 5,061,650 | 10/1991 | Dennison et al. ...................... | 438/253 |
| 5,162,248 | 11/1992 | Dennison et al. ...................... | 438/396 |
| 5,270,241 | 12/1993 | Dennison et al. ...................... | 438/396 |
| 5,292,677 | 3/1994 | Dennison ................................ | 438/396 |
| 5,338,700 | 8/1994 | Dennison et al. ...................... | 438/253 |
| 5,340,763 | 8/1994 | Dennison ................................ | 438/398 |
| 5,340,765 | 8/1994 | Dennison et al. ...................... | 438/396 |
| 5,362,666 | 11/1994 | Dennison ................................ | 438/396 |
| 5,457,063 | 10/1995 | Park ....................................... | 438/254 |
| 5,459,094 | 10/1995 | Jun ......................................... | 438/396 |
| 5,478,772 | 12/1995 | Fazan ..................................... | 438/396 |
| 5,491,356 | 2/1996 | Dennison et al. ...................... | 257/306 |
| 5,494,841 | 2/1996 | Dennison et al. ...................... | 438/210 |
| 5,508,223 | 4/1996 | Tseng ..................................... | 438/396 |
| 5,652,165 | 7/1997 | Lu et al. . | |
| 5,654,238 | 8/1997 | Cronin et al. .......................... | 438/700 |
| 5,702,968 | 12/1997 | Chen ...................................... | 438/253 |
| 5,874,756 | 2/1999 | Ema et al. .............................. | 257/296 |
| 5,926,709 | 7/1999 | Aisou et al. ............................ | 438/253 |
| 5,932,491 | 8/1999 | Wald et al. ............................. | 438/734 |
| 5,946,566 | 8/1999 | Choi ....................................... | 438/239 |
| 5,946,571 | 8/1999 | Hsue et al. ............................. | 438/255 |

*Primary Examiner*—Charles Bowers
*Assistant Examiner*—Evan Pert
*Attorney, Agent, or Firm*—Trask, Britt & Rossa

[57] ABSTRACT

A masking and etching technique during the formation of a memory cell capacitor which utilizes an etching technique to utilize a maximum surface area over the memory cell and to form thin spacers to pattern separation walls between capacitors. This technique results in efficient space utilization which, in turn, results in an increase in the surface area of the capacitor for an increased memory cell capacitance.

10 Claims, 17 Drawing Sheets

CELL CAPACITORS, MEMORY CELLS, MEMORY ARRAYS, AND METHOD OF FABRICATION

BACKGROUND OF THE INVENTION

1. Field of the Invention

The present invention relates to a memory cell capacitor and method for forming said memory cell capacitor. More particularly, the present invention relates to a method of forming memory cell capacitors by efficiently utilizing the area over the surface of a semiconductor substrate.

2. State of the Art

A widely-utilized DRAM (Dynamic Random Access Memory) manufacturing process utilizes CMOS (Complimentary Metal Oxide Semiconductor) technology to produce DRAM circuits which comprise an array of unit memory cells, each including one capacitor and one transistor, such as a field effect transistor. In the most common circuit designs, one side of the transistor is connected to one side of the capacitor, the other side of the transistor and the transistor gate are connected to external circuit lines called the bit line and the word line, and the other side of the capacitor is connected to a reference voltage that is typically one-half the internal circuit voltage. In such memory cells, an electrical signal charge is stored in a storage node of the capacitor connected to the transistor that charges and discharges the circuit lines of the capacitor.

Higher performance, lower cost, increased miniaturization of components, and greater packaging density of integrated circuits are ongoing goals of the computer industry. The advantages of increased miniaturization of components include: reduced-bulk electronic equipment, improved reliability by reducing the number of solder or plug connections, lower assembly and packaging costs, and improved circuit performance. In pursuit of increased miniaturization, DRAM chips have been continually redesigned to achieve ever higher degrees of integration. However, as the dimensions of the DRAM chips are reduced, the occupation area of each unit memory cell of the DRAM chips must be reduced. This reduction in occupied area necessarily results in a reduction of the dimensions of the capacitor, which, in turn, makes it difficult to ensure required storage capacitance for transmitting a desired signal without malfunction. However, the ability to densely pack the unit memory cells, while maintaining required capacitance levels, is a crucial requirement of semiconductor manufacturing if future generations of DRAM chips are to be successfully manufactured. This drive to produce smaller DRAM circuits has given rise to a great deal of capacitor development.

In order to minimize such a decrease in storage capacitance caused by the reduced occupied area of the capacitor, the capacitor should have a relatively large surface area within the limited region defined on a semiconductor substrate. However, for reasons of available capacitance, reliability, and ease of fabrication, most capacitors are stacked capacitors in which the capacitor covers nearly the entire area of a cell and in which vertical portions of the capacitor contribute significantly to the total charge storage capacity. In such designs, the side of the capacitor connected to the transistor is generally called the "storage node" or "storage poly" (since the material out of which it is formed is doped polysilicon) while the polysilicon layer defining the side of the capacitor connected to the reference voltage, mentioned above, is called the "cell poly".

U.S. Pat. No. 5,292,677 issued Mar. 8, 1994 to Dennison and U.S. Pat. No. 5,459,094 issued Oct. 17, 1995 to Jun each teach methods for fabricating capacitors for memory cells. However, as with other known fabrication methods, these methods require numerous complex steps in forming the capacitors and do not maximize the size of the capacitor by efficient use of the space above the semiconductor substrate.

Therefore, it would be advantageous to develop a technique for forming a high surface area capacitor and a memory cell employing same, while using inexpensive, commercially-available, widely-practiced semiconductor device fabrication techniques and apparatus without requiring complex processing steps.

SUMMARY OF THE INVENTION

The present invention is a novel masking and etching technique for the formation of a memory cell capacitor and a memory cell by forming containment recesses which efficiently utilize the space above the semiconductor substrate. The capacitors are made by using thin spacers to pattern barrier material separation walls between the capacitors. This allows the capacitors to utilize the maximum amount of the area on the surface of the chip by minimizing the amounts of the barrier material present. The efficient utilization of the space above the semiconductor substrate increases the surface area of the storage poly node. The increase in the storage poly node surface area results in increased memory cell capacitance without complex processing steps.

The method of the present invention occurs after formation of an intermediate structure comprising transistor gates on a silicon substrate which has been oxidized to form thick field oxide areas and which has been exposed to implantation processes to form drain and source regions. The intermediate structure further comprises at least one barrier layer which covers the transistor gates and the silicon substrate.

The method of the present invention comprises patterning a first resist on the barrier layer. The pattern is a predetermined pattern which ultimately forms a specifically-shaped capacitor. After the first resist is patterned, the barrier layer is lightly etched to a predetermined depth. The first resist is then stripped and a shield layer is deposited over the etched surface of the barrier layer. A second resist is patterned on the shield layer. The shield layer is then etched with a selective etchant to etch the shield layer material such that a portion of the shield layer under the second resist and a portion in corners of the etched barrier layer (hereinafter, "the thin spacers") remain. Thus, the depth of the light etch in the barrier layer must be sufficient to achieve a desired height of the thin spacers. Selective etching, as referred to herein, relates to using etchants which etch only a particular material while being substantially inert to other materials.

The barrier layer is then etched with an etchant selective to the buffer layer in order to expose a portion of the transistor gates, a portion of the active areas, and a portion of the field oxide areas. This etching forms bitline areas under the second resist and barrier material separation walls under the thin spacers. The second resist is removed. A storage poly layer for the lower cell plate of the capacitor is deposited over the exposed transistor gates, the exposed active areas, the exposed field oxide areas, the bitline areas and barrier material separation walls. A support material is applied over the lower cell plate. The structure is then planarized to remove the silicon nitride layer portions. This planarization also separates the storage poly layer into individual capacitor areas.

A dielectric layer is deposited over the storage poly layer and the exposed portion of bitline areas and barrier material separation walls. A cell poly layer is then deposited over the dielectric layer. A resist layer is patterned on the cell poly layer, and the cell poly layer and dielectric layer are etched to expose a portion of each bitline area over an area where a bitline will be formed. Subsequent steps known in the art are used to form the bitline and complete the memory circuit.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PREFERRED EMBODIMENTS

Figure 1:
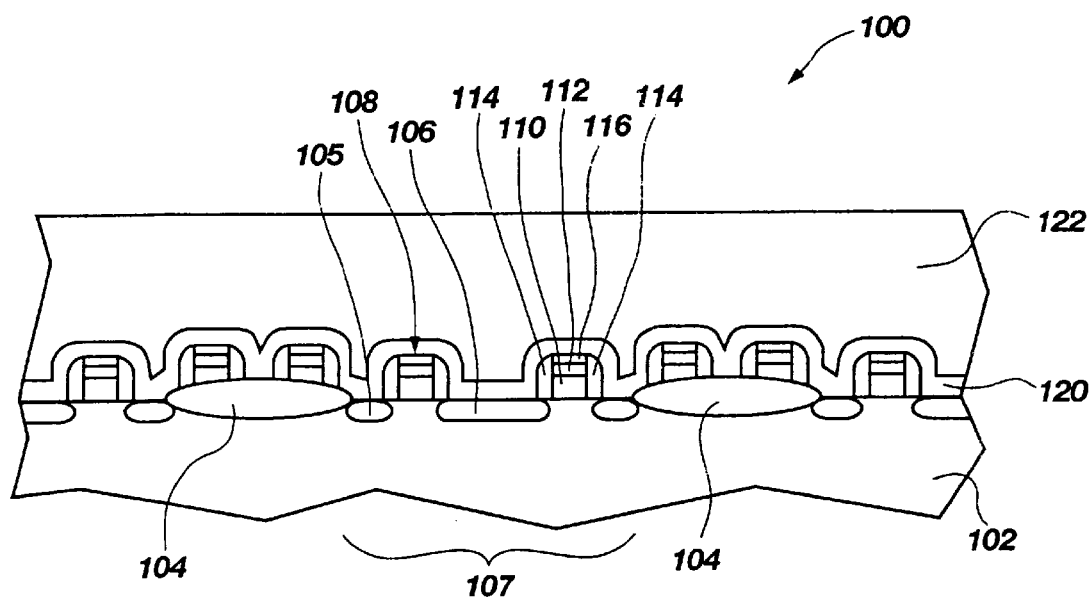
FIGS. 1–15 illustrate cross-sectional views and top plan views of a method of fabricating a capacitor for a memory cell according to the present invention.

FIGS. 1–15 illustrate a technique for forming a capacitor for a memory cell. FIG. 1 illustrates an intermediate structure 100 in the production of a memory cell. This intermediate structure 100 comprises a substrate 102, such as a lightly doped P-type crystal silicon substrate, which has been oxidized to form thick field oxide areas 104 and exposed to implantation processes to form drain regions 105 and source regions 106 of N+ doping. Transistor gate members 108 are formed on the surface of the substrate 102, including gate members 108 residing on a substrate active area 107 spanned between the drain regions 105 and the source regions 106 and gate members 108 residing on the thick field oxide areas 104. The transistor gate members 108 each comprise a lower buffer layer 110, preferably made of silicon dioxide, separating a gate conducting layer or wordline 112 of the transistor gate member 108 from the substrate 102. Transistor insulating spacer members 114, preferably made of silicon nitride, are formed on either side of each transistor gate member 108. A cap insulator 116, also preferably made of silicon nitride, is formed on the top of each transistor gate member 108. A first barrier layer 120 (preferably made of tetraethyl orthosilicate—TEOS or the like) is applied over the transistor gate members 108 and the substrate 102. A second barrier layer 122 (preferably made of borophosphosilicate glass—BPSG, phosphosilicate glass—PSG, or the like) is deposited over the first barrier layer 120. The second barrier layer 122 is then planarized, preferably using a mechanical abrasion, such as a chemical mechanical planarization (CMP) process.

It is, of course, understood that a single barrier layer could be employed. However, a typical barrier configuration is a layer of TEOS over the transistor gate members 108 and the substrate 102 followed by a BPSG layer over the TEOS layer. The TEOS layer is applied to prevent dopant migration. The BPSG layer contains boron and phosphorus which can migrate into the source and drain regions formed on the substrate during inherent device fabrication heating steps. This migration of boron and phosphorus can change the dopant concentrations in the source and drain regions which can adversely affect the transistor performance.

Figure 2:
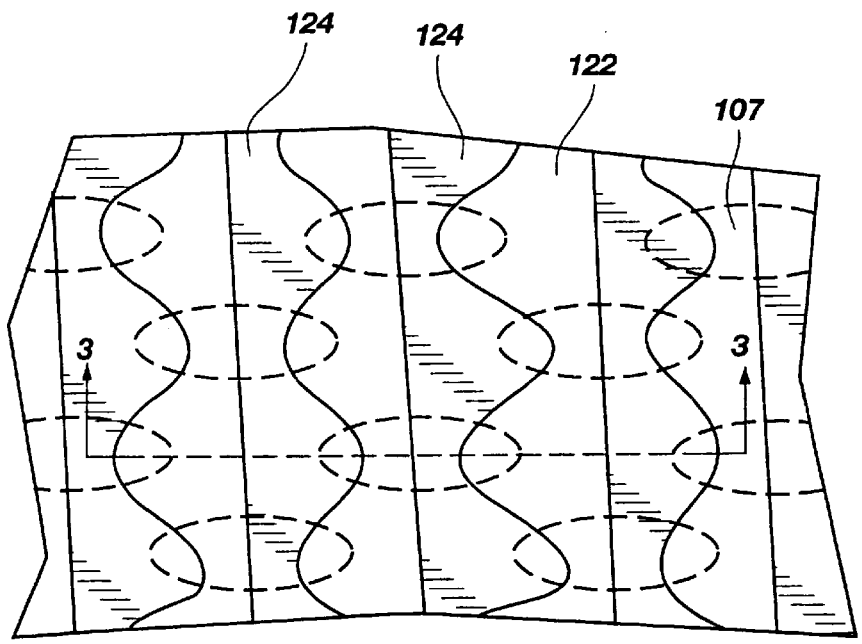
Figure 3:
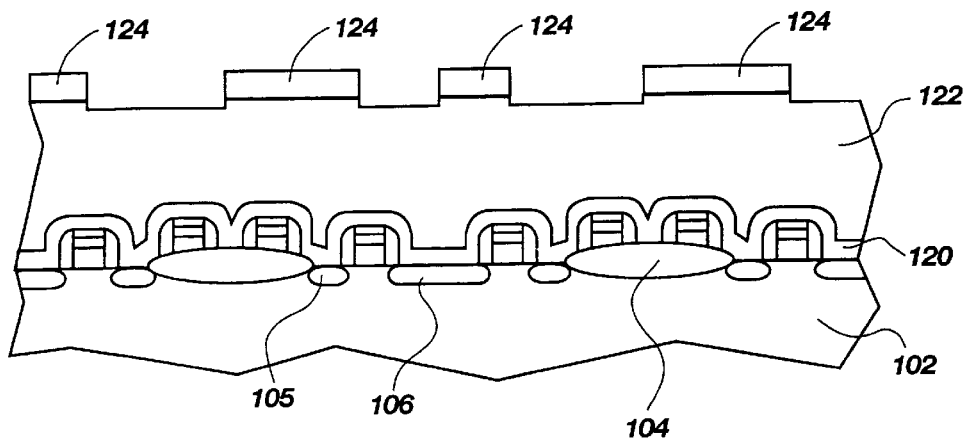

A first resist layer 124 (shown as shaded in FIG. 2) is patterned on the second barrier layer 122 in a predetermined pattern to ultimately form a specifically shaped capacitor, as shown in FIG. 2 in a top view and shown in FIG. 3 in cross-section along line 3—3 of FIG. 2. The relative positions of the active areas 107 are shown in broken lines for visual orientation.

Figure 4:
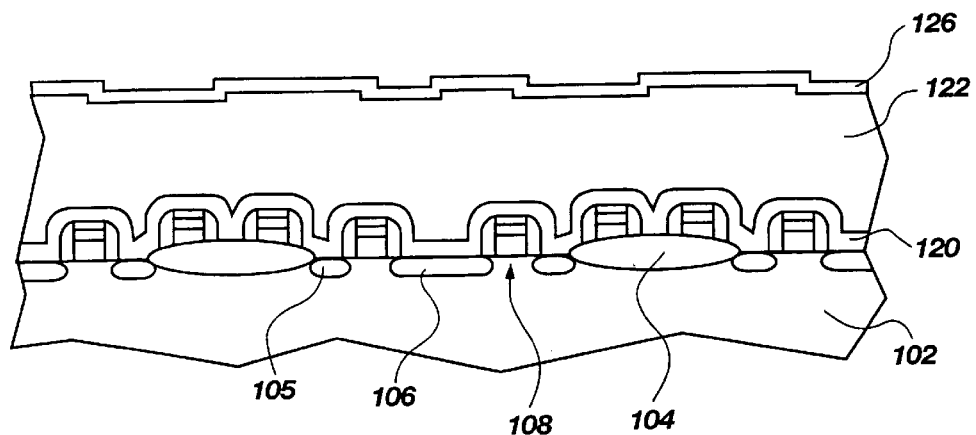
Figure 5:
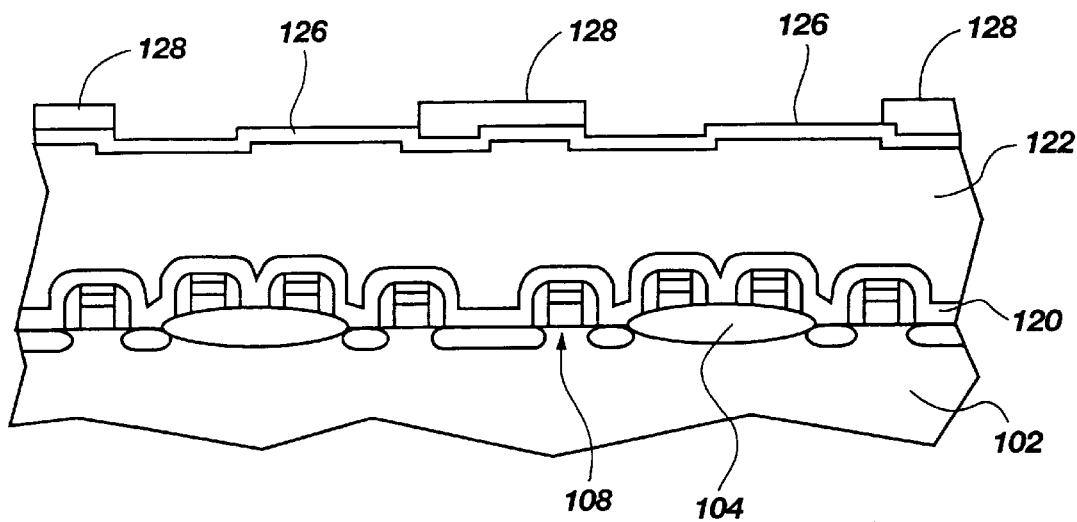

After the first resist layer 124 is patterned, the second barrier layer 122 is lightly etched to a predetermined depth, as shown in FIG. 3. The first resist layer 124 is then stripped and a shield layer 126, preferably made of silicon nitride or a poly silicon, is deposited over the etched surface of the etched second barrier layer 122, as shown in FIG. 4. As shown in FIG. 5, a second resist 128 is patterned on the shield layer 126 to protects areas which will subsequently be used to form bit lines.

Figure 6:
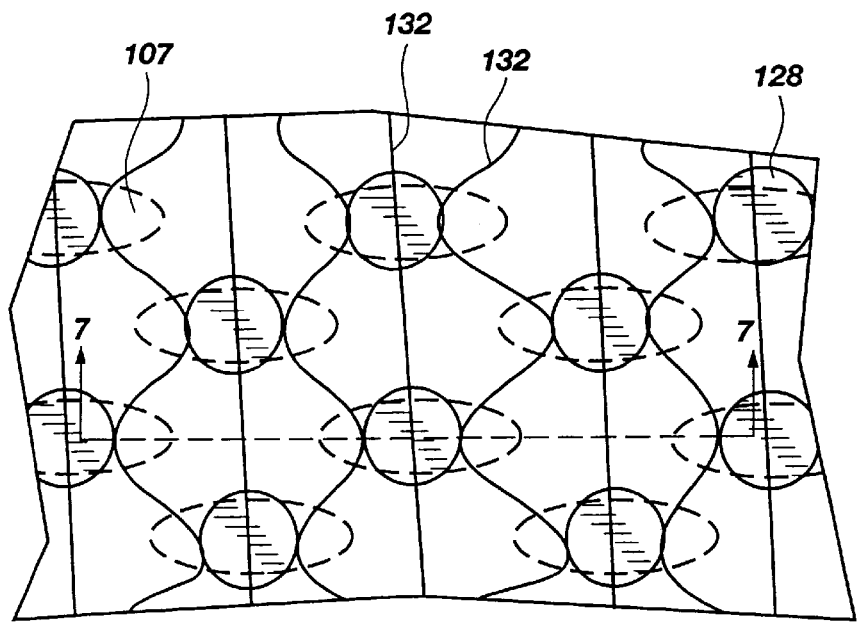
Figure 7:
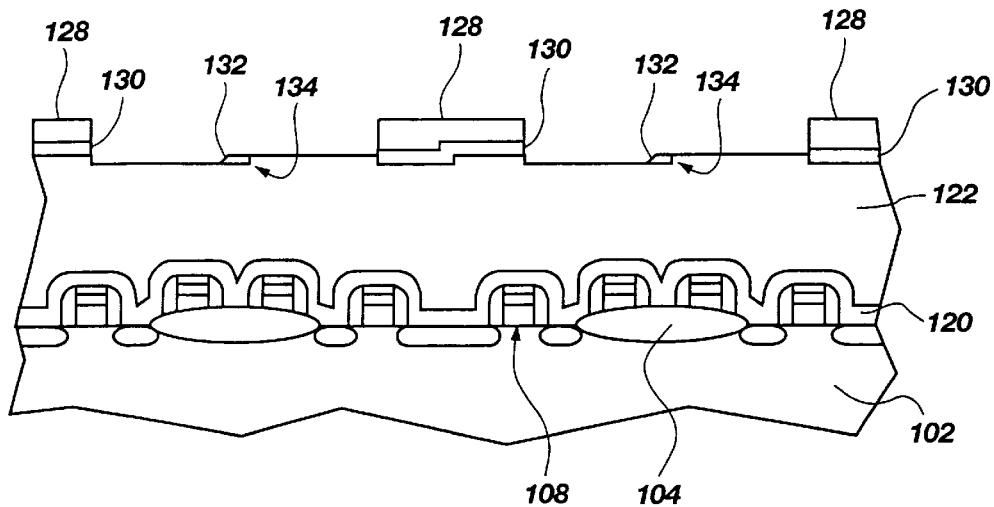

The shield layer 126 is then etched such that a portion 130 of the shield layer 126 under the second resist 128 and a portion 132 located in corners 134 of the etched second barrier layer 122 remain (the second resist corner portion 132 will hereinafter be referred to as "thin spacers 132"), as shown in FIG. 6 in a top view and shown in FIG. 7 in cross-section along line 7—7 of FIG. 6. The "waving" pattern, shown in FIG. 6 of this embodiment, is advantageous in that it allows for easy printing of desired line widths. The ease in printing is a result of the way light behaves during photolithography which makes it very difficult to print sharp corners.

The depth of the etch (etch selectivity will establish this etch depth) in the second barrier layer 122 is determined by the required height of the shield layer 126. The height of the thin spacer 132 should be sufficient to allow the patterning to take place, taking into account an amount of thin spacer 132 lost during the etching. The thickness of the shield layer 126 less an amount lost during the etching will determine the width of the thin spacers 132. Preferably, the width of the thin spacers 132 is about 1000 angstroms.

Figure 8:
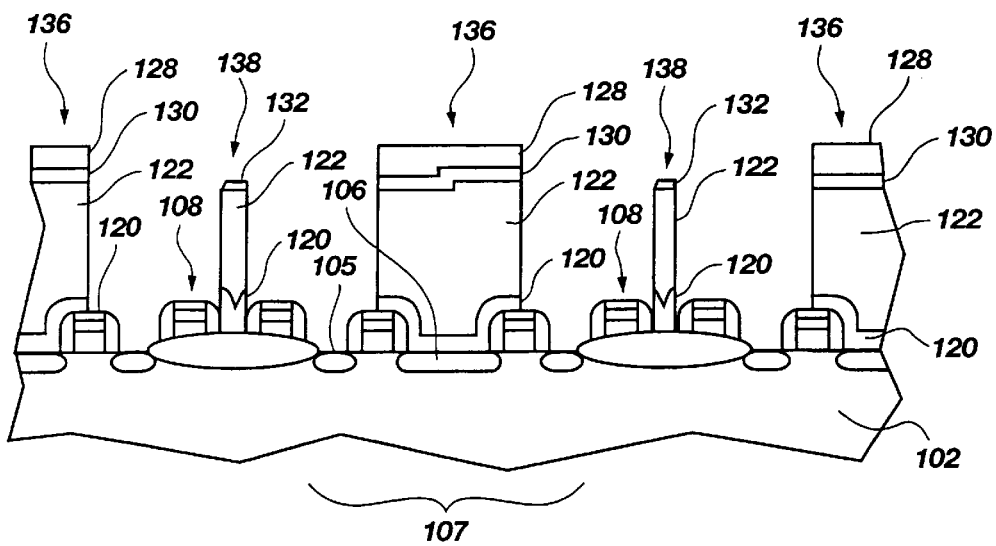

As shown in FIG. 8, the second barrier layer 122 is then selectively etched to expose a portion of the transistor gate members 108, a portion of the active areas 107 and a portion of the field oxide areas 104. This etching forms bitline areas or columns 136 under the second resist 128 and barrier material separation walls 138 under the thin spacers 132 (the thin spacers 132 act as a mask). It is, of course, understood that the etches described in FIGS. 7 and 8 can be done in situ.

Figure 9:
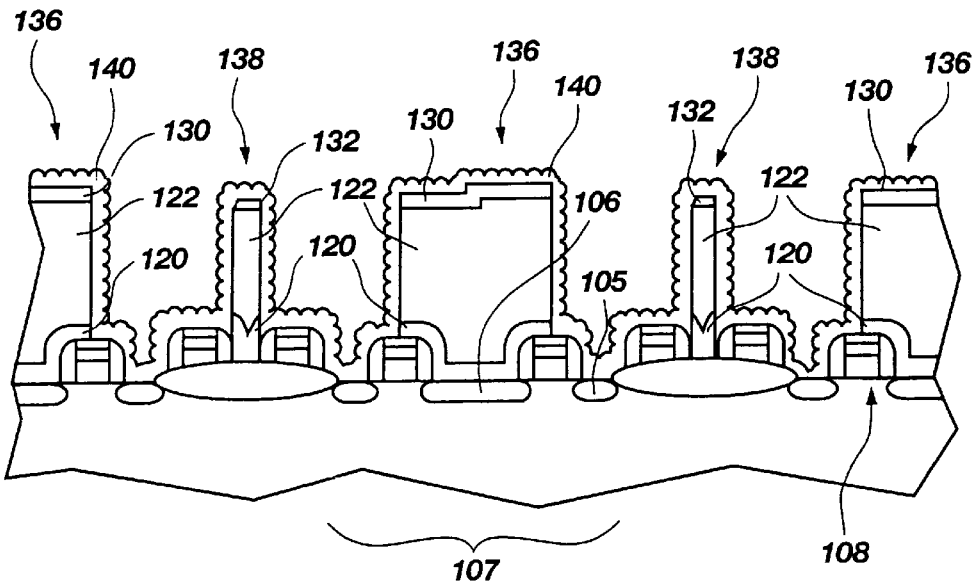
Figure 10:
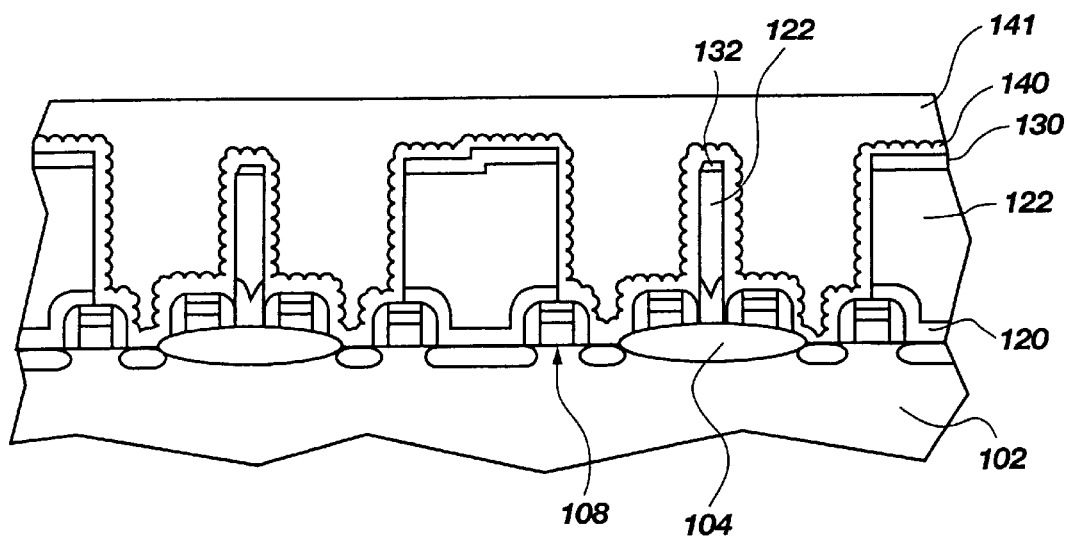
Figure 11:
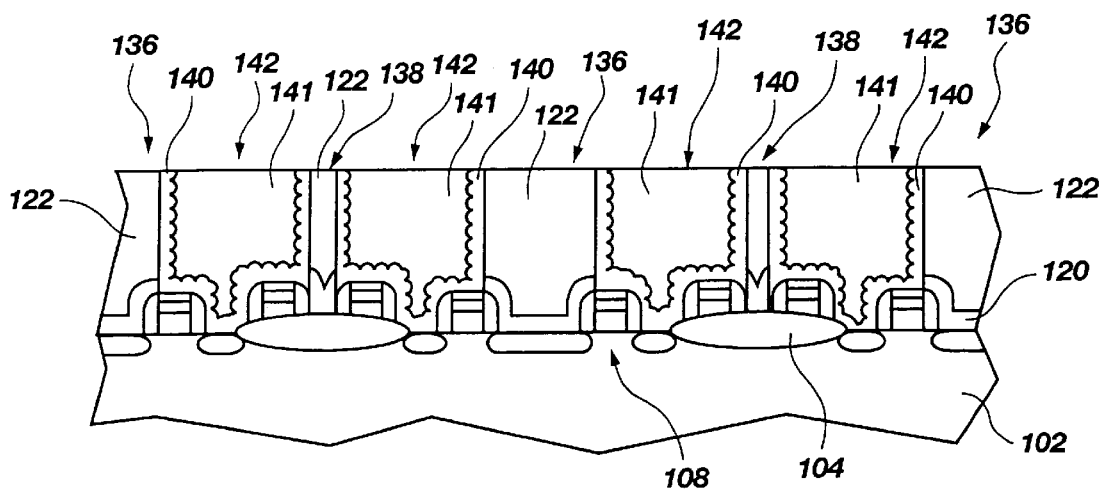

As shown in FIG. 9, the second resist 128 is removed and a storage poly layer 140 for the lower cell plate of the capacitor is deposited over the exposed transistor gate members 108, the exposed active areas 107, the exposed field oxide areas 104, the bitline areas or columns 136 and barrier material separation walls 138. A support material 141 is deposited over the storage poly layer 140, as shown in FIG. 10. The structure is then planarized, preferably by chemical mechanical planarization (CMP) or a planar etch back process, to remove the silicon nitride layer portions 130 and 132. This planarization also separates the storage poly layer 140 into individual capacitor areas 142, as shown in FIG. 11.

Figure 12:
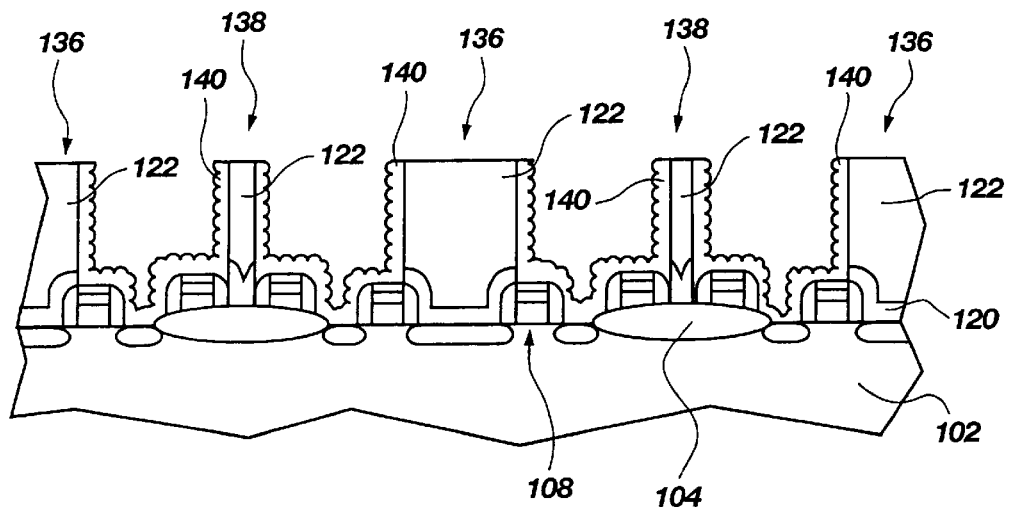
Figure 13:
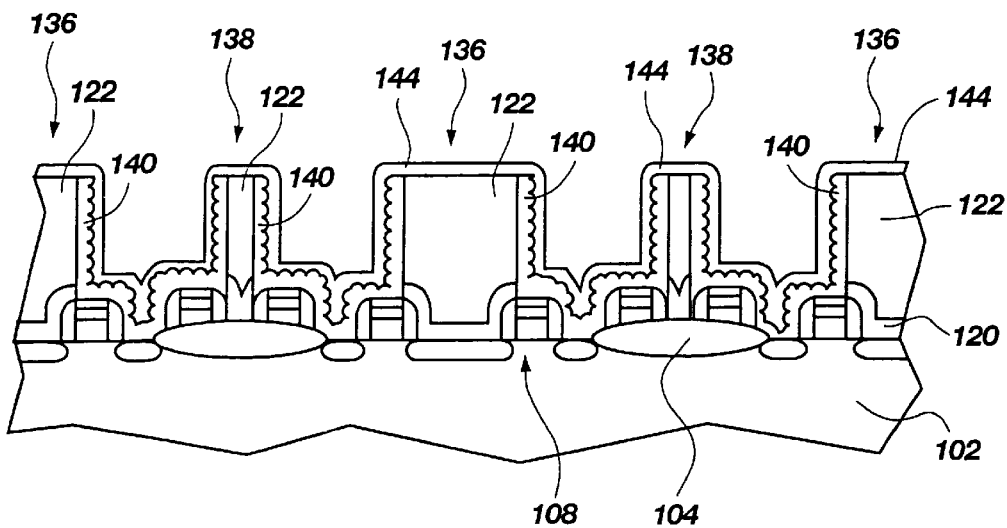
Figure 14:
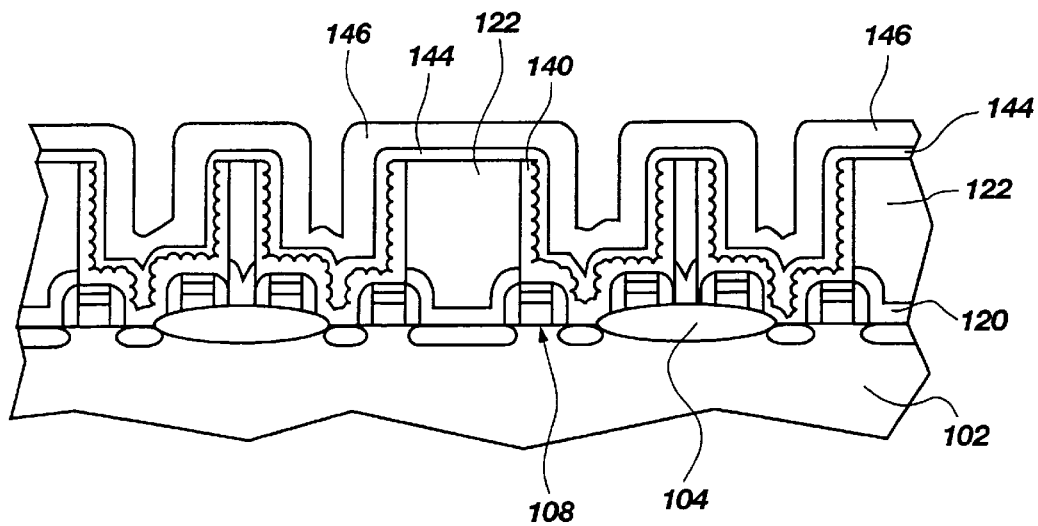
Figure 15:
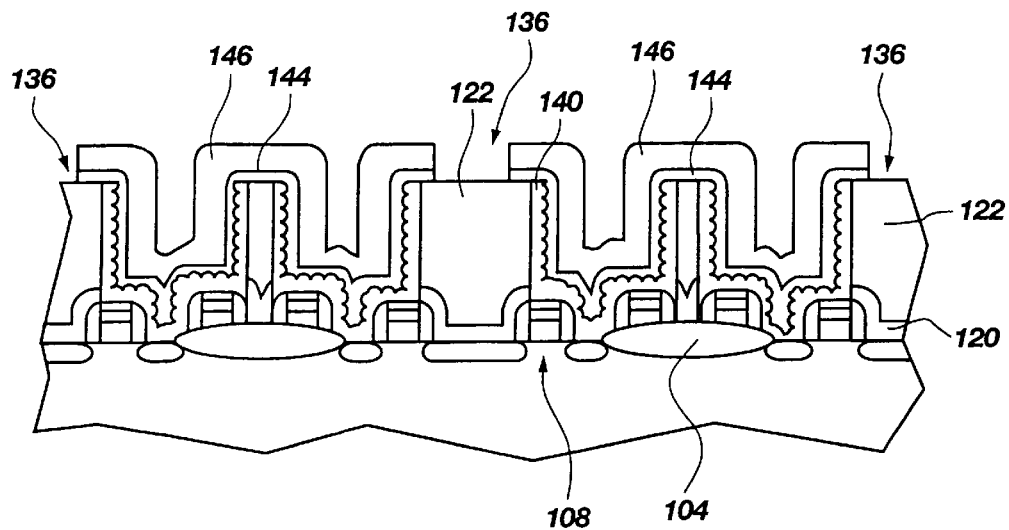

The support material 141 is then removed, as shown in FIG. 12, and a dielectric layer 144, preferably composed of O—N—O, is deposited over the storage poly layer 140 and the exposed portion of bitline areas or columns 136 and walls 138, as shown in FIG. 13. A cell poly layer 146 is then deposited over the dielectric layer 144, as shown in FIG. 14. A resist layer (not shown) is patterned on the cell poly layer 146 and the cell poly layer 146 and dielectric layer 144 are etched to expose a portion of each bitline area or column 136, as shown in FIG. 15.

Figure 16:
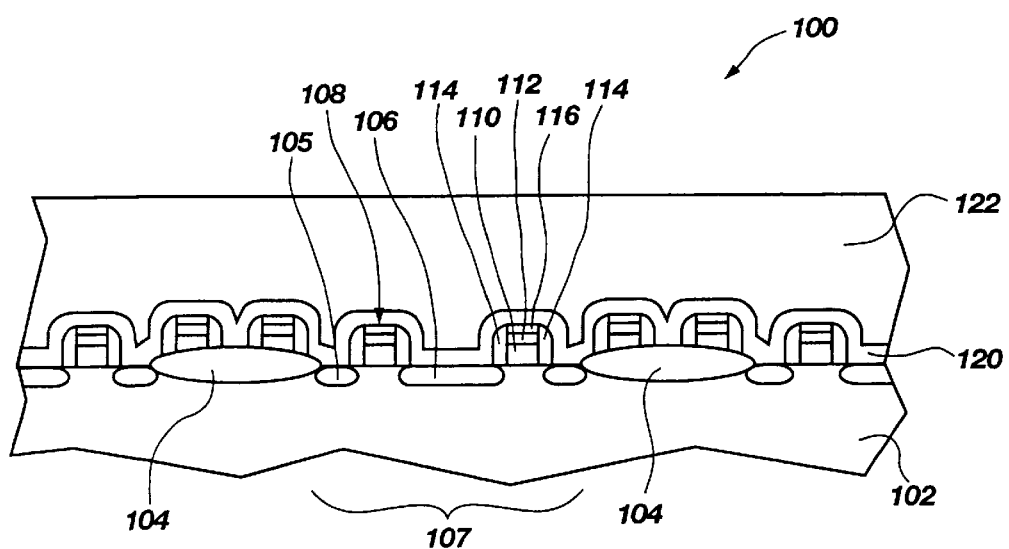
FIGS. 16–32 illustrate cross-sectional views and top views of alternate patterns for the first and second resist in a method of fabricating a capacitor according to the present invention.

FIGS. 16–32 illustrate alternate patterning techniques for forming a capacitor for a memory cell. Elements common to FIGS. 1–15 and 16–32 retain the same numeric designation. FIG. 16 illustrates the intermediate structure 100 as defined in FIG. 1, including a substrate 102 which has been oxidized to form thick field oxide areas 104 and exposed to implantation processes to form drain regions 105 and source regions 106, and including transistor gate members 108 formed on the surface of the substrate 102. The first barrier layer 120 is applied over the transistor gate members 108 and the substrate 102. The second barrier layer 122 is deposited over the first barrier layer 120 and planarized.

Figure 17:
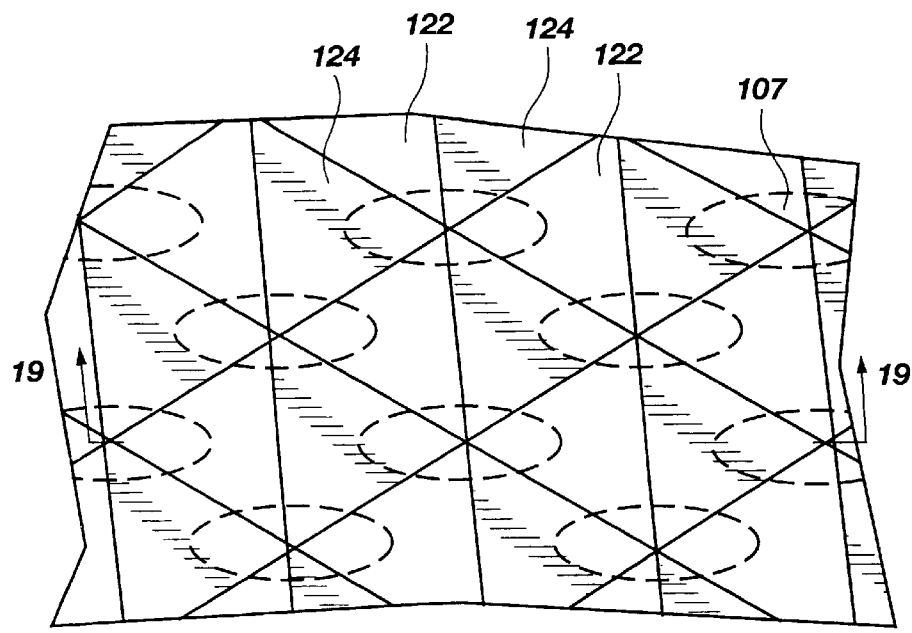
Figure 18:
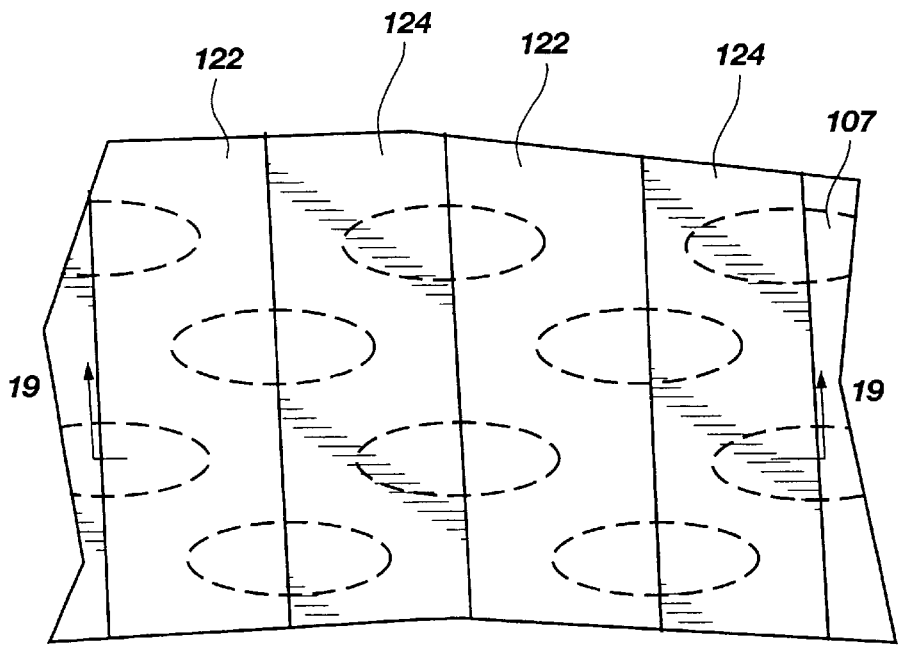

The first resist layer 124 is patterned on the second barrier layer 122 in a predetermined pattern to ultimately form a specifically shaped capacitor. An innumerable variety of patterns of the first resist layer 124 can be fashioned. Two examples of patterns of the first resist 124 (shown as shaded) are illustrated in FIGS. 17 and 18 as top views (the relative positions of the active areas 107 are shown in broken lines for visual orientation). The cross-sectional view shown in FIG. 19 is taken along either line A—A of FIG. 17 or line B—B of FIG. 18.

Figure 19:
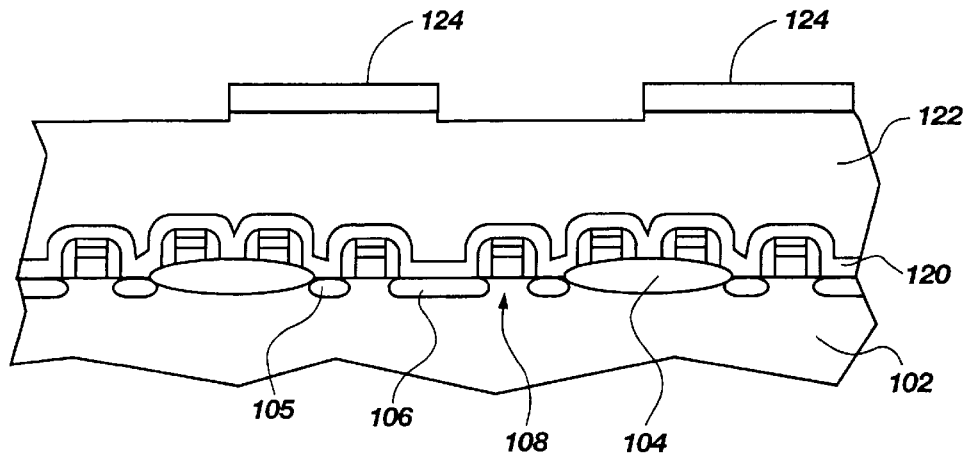
Figure 20:
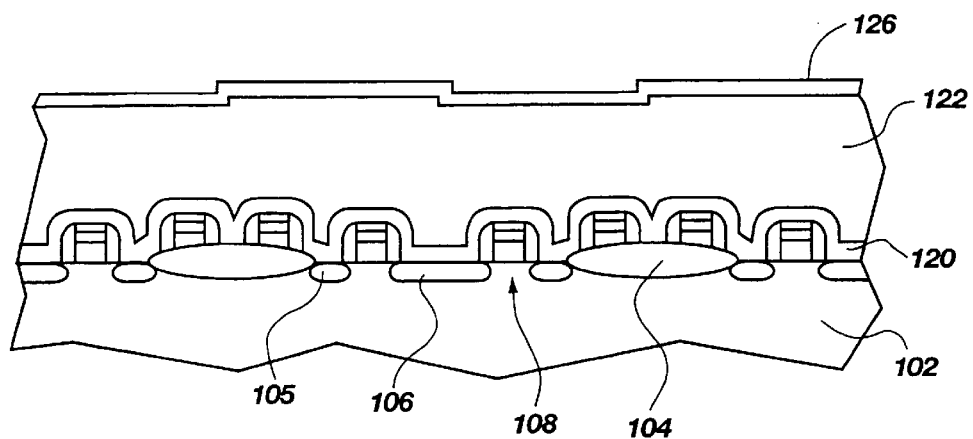
Figure 21:
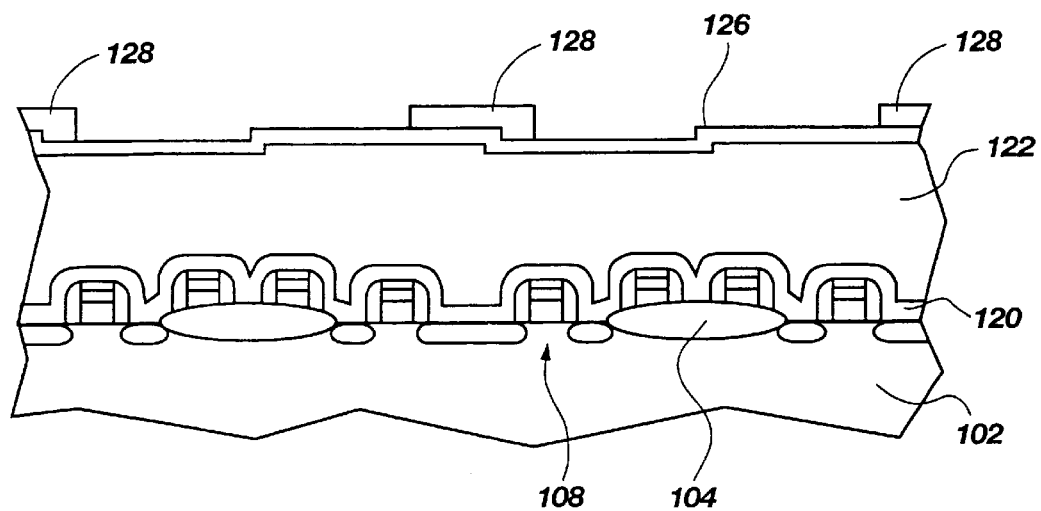
Figure 22:
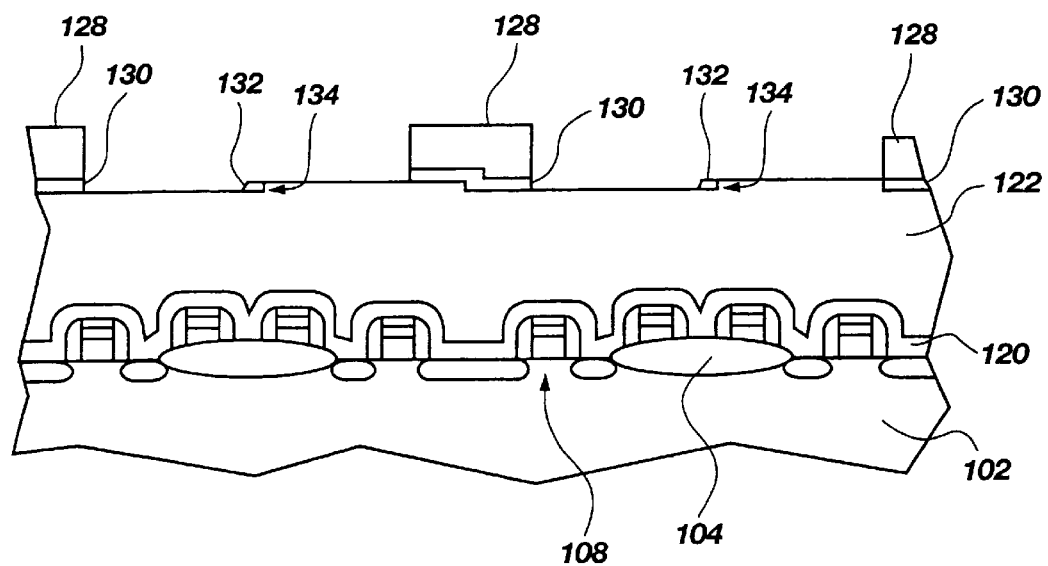

After the first resist layer 124 is patterned, the second barrier layer 122 is lightly etched to a predetermined depth, as shown in FIG. 19. The first resist layer 124 is then stripped and the shield layer 126 is deposited over the etched surface of the etched second barrier layer 122, as shown in FIG. 20. As shown in FIG. 21, the second resist 128 is patterned on the shield layer 126 to protected areas which will subsequently be used to form bit lines.

Figure 23:
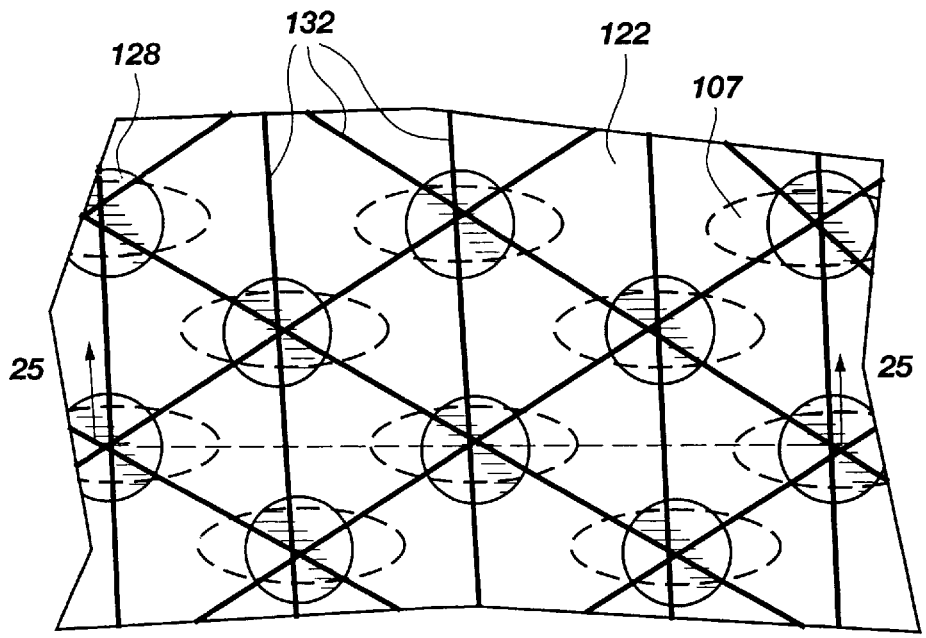
Figure 24:
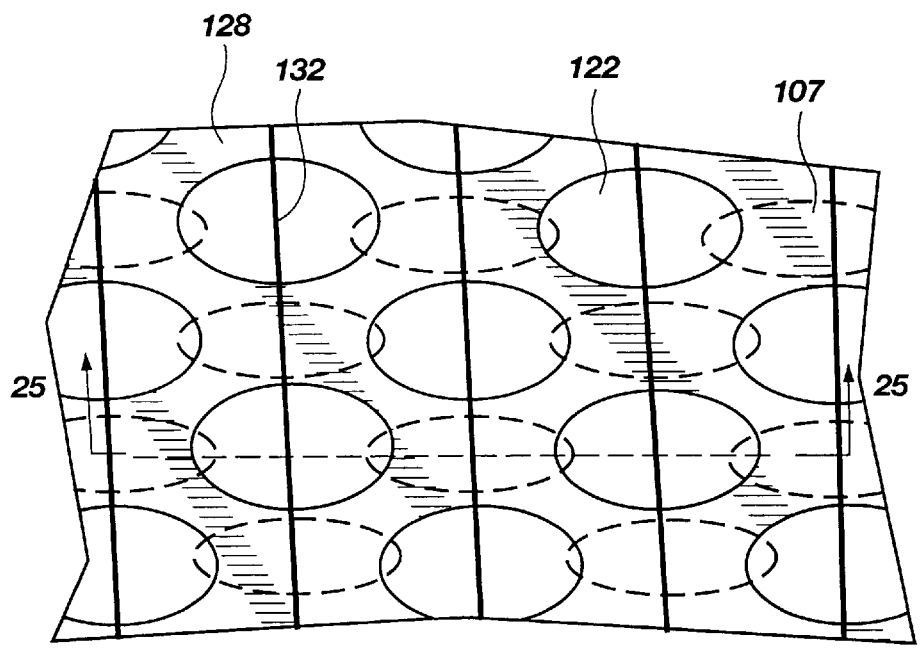

The shield layer 126 is then etched such that a portion 130 of the shield layer 126 under the second resist 128 and a portion 132 located in corners 134 of the etched second barrier layer 122 remain (the second resist corner portion 132 will hereinafter be referred to as "thin spacers 132"), as shown in FIGS. 23 and 24 in a top view. The top views of the patterns of the second resist 128 (shown as shaded) and the thin spacers 132 are shown in FIGS. 23 (corresponding to the first resist pattern of FIG. 17) and 24 (corresponding to the first resist pattern of FIG. 18). It will be seen in subsequent steps of the present invention that the resist patterns of FIGS. 17 and 23 will form prism shaped capacitors and the resist patterns of FIGS. 18 and 24 will form half-moon shaped capacitors. The cross-sectional view shown in FIG. 25 is taken along either line 25—25 of FIG. 23 or line 25—25 of FIG. 24.

Figure 25:
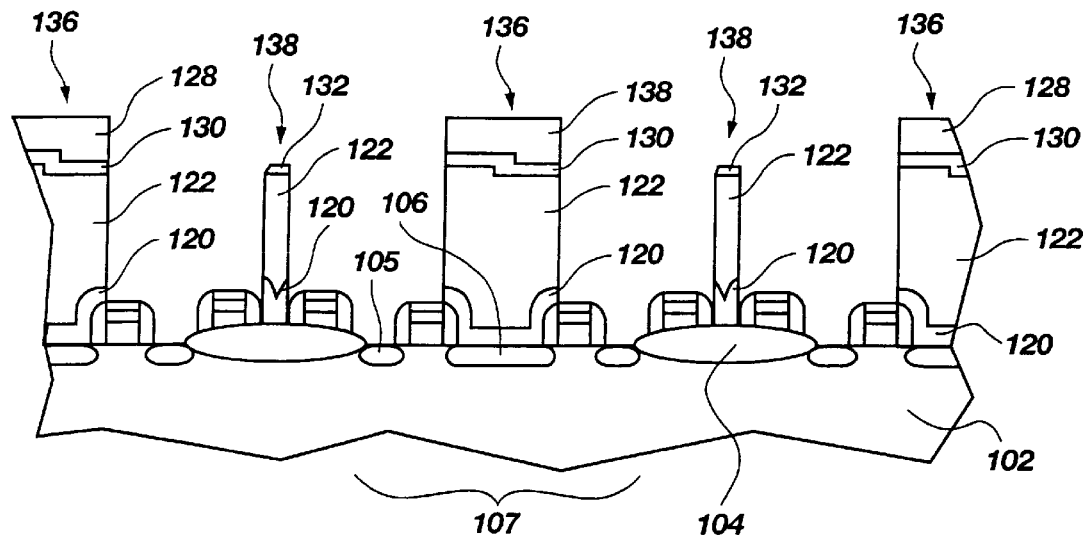

As shown in FIG. 25, the second barrier layer 122 is then selectively etched to expose a portion of the transistor gate members 108, a portion of the active areas 107 and a portion of the field oxide areas 104. This etching forms bitline areas or columns 136 under the second resist 128 and barrier material separation walls 138 under the thin spacers 132 (the thin spacers 132 act as a mask).

Figure 26:
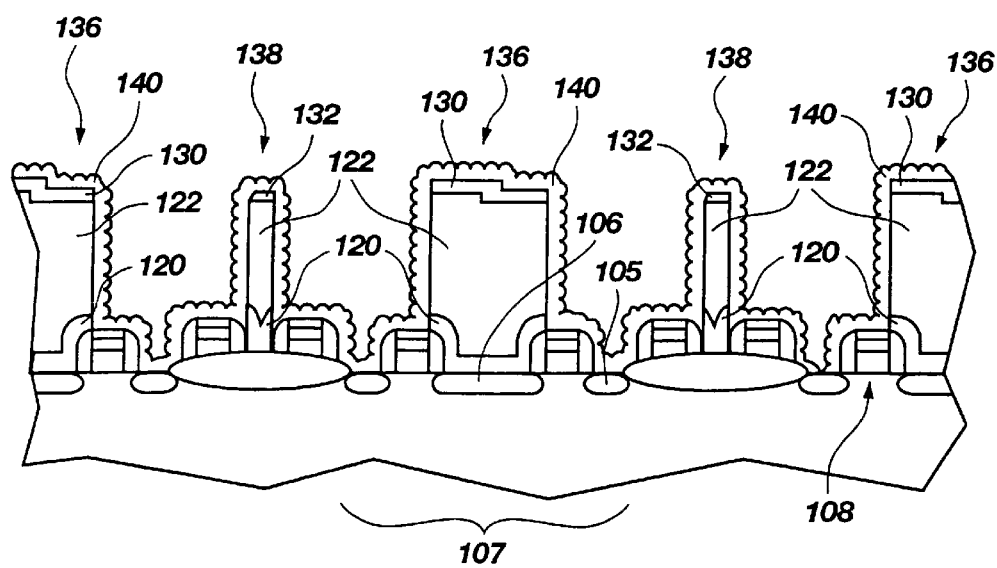
Figure 27:
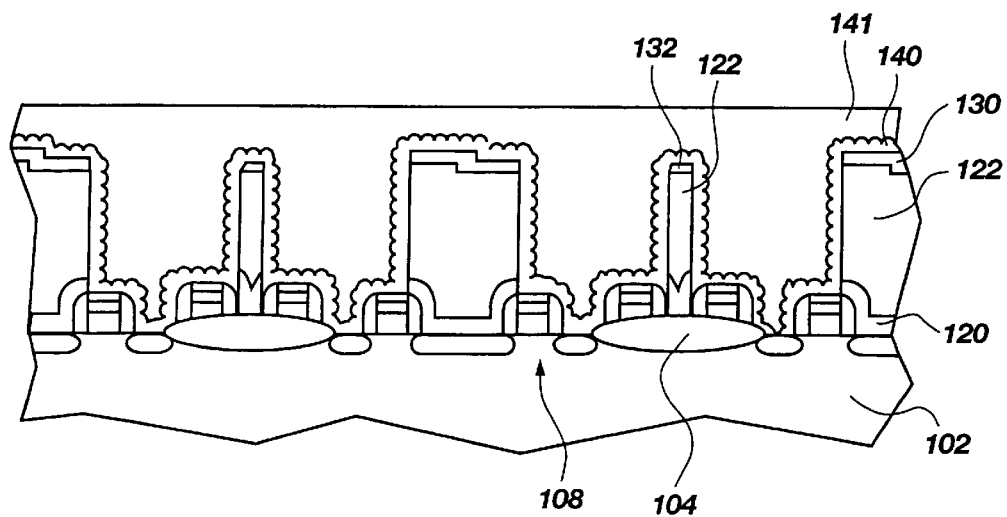
Figure 28:
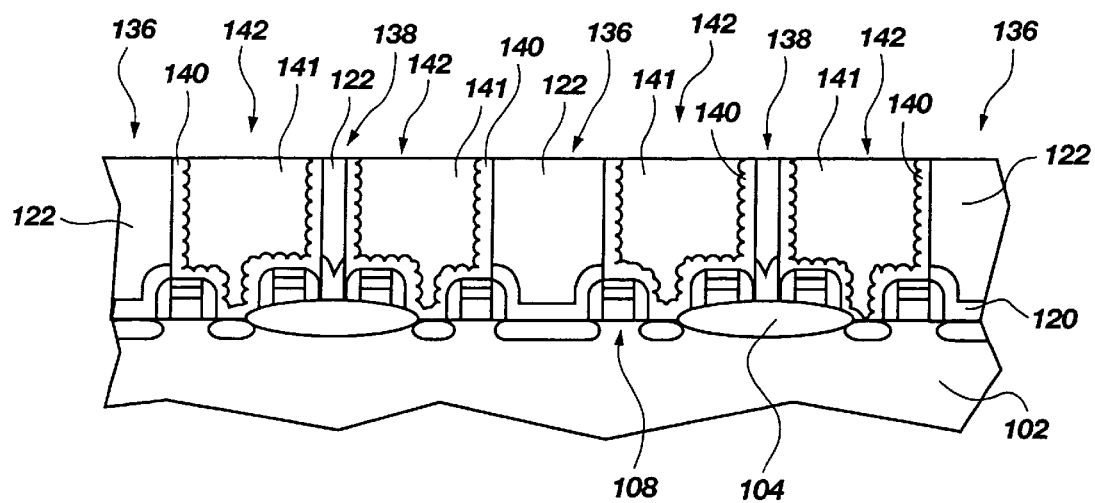

As shown in FIG. 26, the second resist 128 is removed and the storage poly layer 140 for the lower cell plate of the capacitor is deposited over the exposed transistor gate members 108, the exposed active areas 107, the exposed field oxide areas 104, the bitline areas or columns 136 and barrier material separation walls 138. A support material 141 is deposited over the storage poly layer 140, as shown in FIG. 27. The structure is then planarized to remove the silicon nitride layer portions 130 and 132. This planarization also separates the storage poly layer 140 into individual capacitor areas 142, as shown in FIG. 28.

Figure 29:
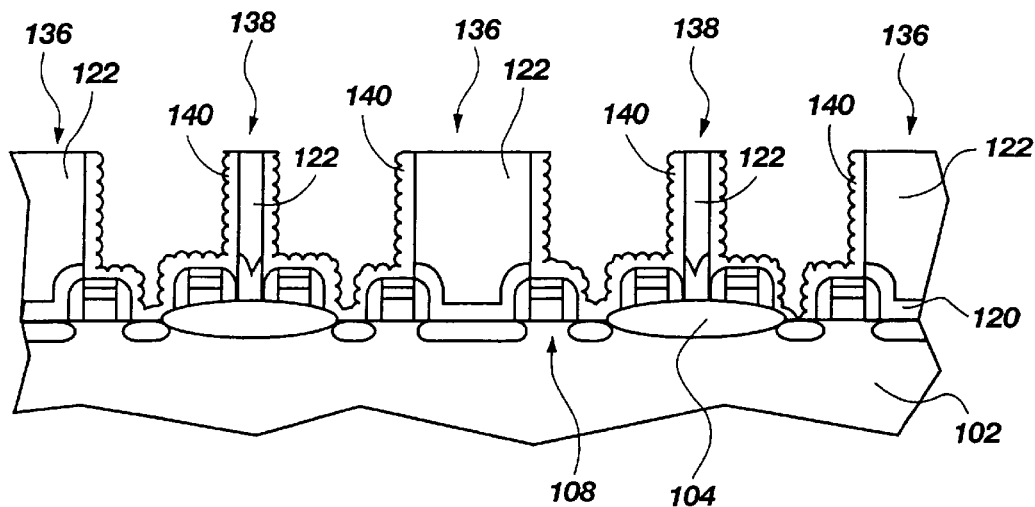
Figure 30:
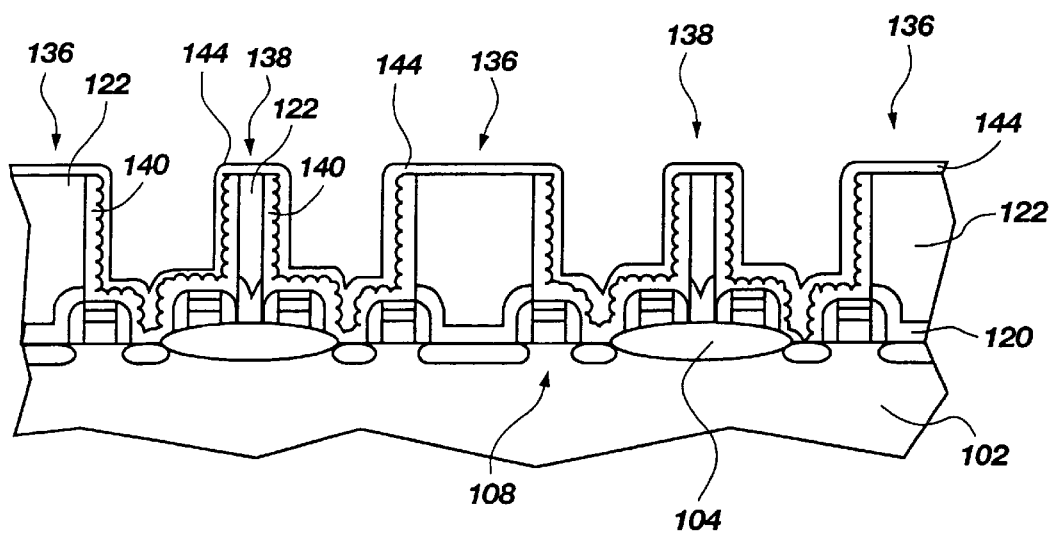
Figure 31:
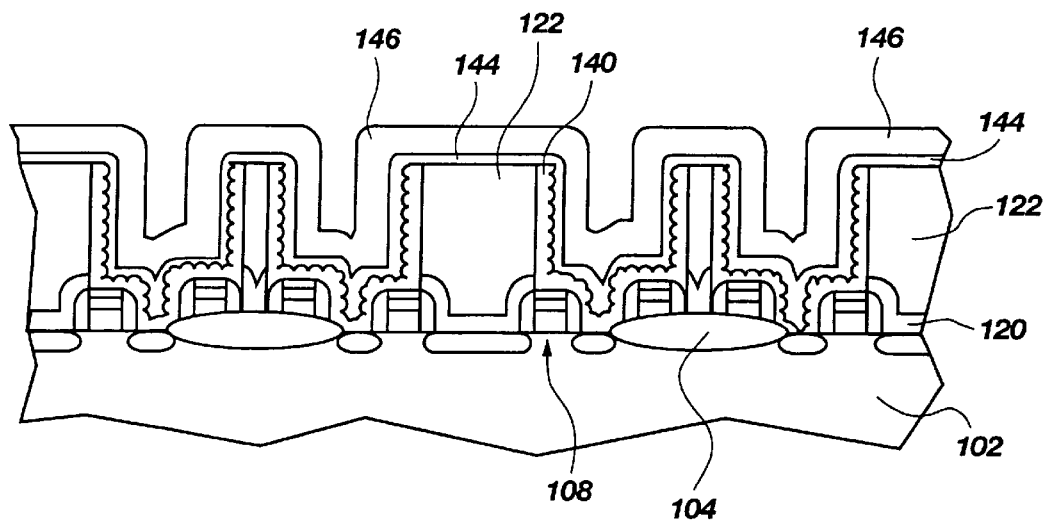
Figure 32:
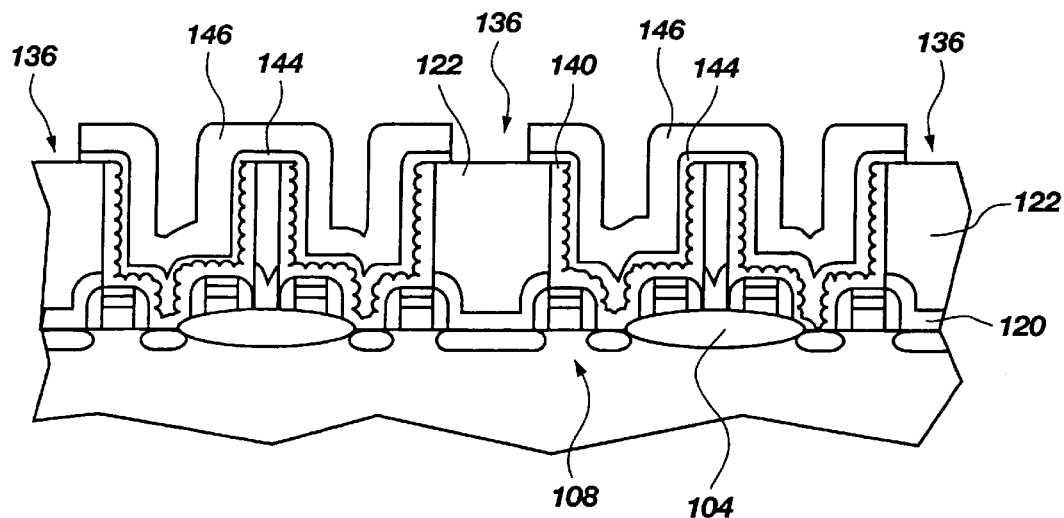

The support material 141 is then removed, as shown in FIG. 29, and a dielectric layer 144, preferably composed of O—N—O, is deposited over the storage poly layer 140 and the exposed portion of bitline areas or columns 136 and walls 138, as shown in FIG. 30. A cell poly layer 146 is then deposited over the dielectric layer 144, as shown in FIG. 31. A resist layer (not shown) is patterned on the cell poly layer 146 and the cell poly layer 146 and dielectric layer 144 are etched to expose a portion of each bitline area or column 136, as shown in FIG. 32.

Figure 33:
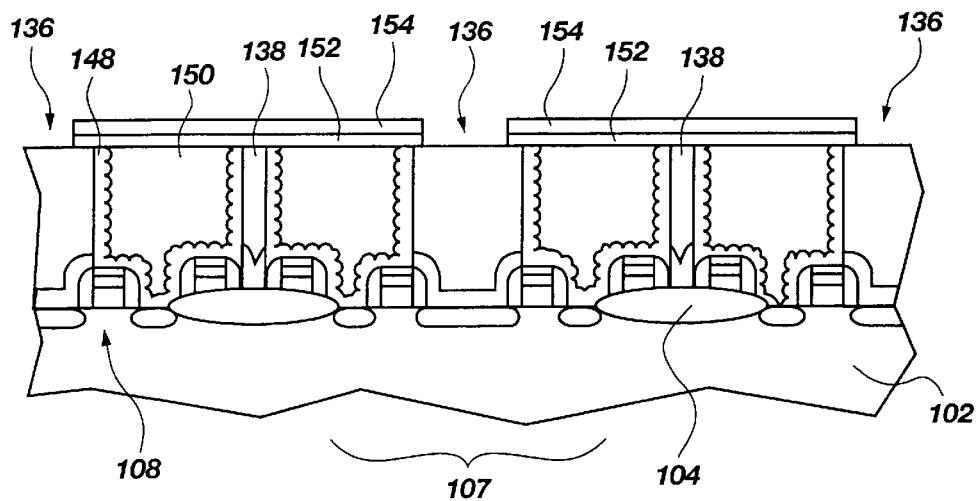
FIG. 33 illustrates a cross-sectional view of a high dielectric constant plug cell capacitor for a memory cell of the present invention.

The capacitor may also be formed with a high dielectric constant plug cell, as shown in FIG. 33. The formation of high dielectric constant plug cells is taught in commonly-owned U.S. Pat. No. 5,478,772 issued Dec. 26, 1995 to Fazan, hereby incorporated herein by reference. All elements in FIG. 33 which are common to FIGS. 1–16 retain the same numeric designation. Beginning with the embodiment of FIG. 8, an optional barrier layer 148 may be deposited over the exposed transistor gate members 108, the exposed active areas 107, the exposed field oxide areas 104, the bitline areas or columns 136 and the barrier material separation walls 138. A conductive material 150 is deposited over the optional barrier layer 148 to fill the areas between the bitline areas or columns 136 and the barrier material separation walls 138. The optional barrier layer 148 is used when the conductive material 150 has the potential of contaminating or damaging the exposed active areas 107, the exposed field oxide areas 104, and/or the exposed transistor gate members 108. A typical, potentially damaging conductive material 150 is tungsten with which a titanium or titanium nitride optional barrier layer 148 may be employed.

The structure is then planarized, preferably by chemical mechanical planarization (CMP), to remove the silicon nitride layer portions 130 on the bitline areas or columns 136 and the thin spacers 132 which isolate the optional barrier layer 148 and the conductive material 150 into individual cell capacitor nodes. A dielectric layer 152 and an upper cell plate layer 154 are respectively deposited over the planarized structure. A resist layer is patterned on portions of the upper cell plate layer 154. The upper cell plate layer 154 and the dielectric layer 152 are then etched to expose a portion of each bitline area or column 136 where a bitline will be formed. The resist is then stripped to form the structure shown in FIG. 33.

Preferably, the dielectric constant plug cell of FIG. 33 comprises a BST (barium-strontium-titanate) material as the dielectric layer 152 and platinum as conductive material 150 and the upper cell plate layer 154. Using platinum as a conductive material 150 requires use of the barrier layer 148. The material used as the barrier layer 148 can include but is not limited to titanium nitride, titanium aluminum nitride, and titanium-tungsten alloy.

Figure 34:
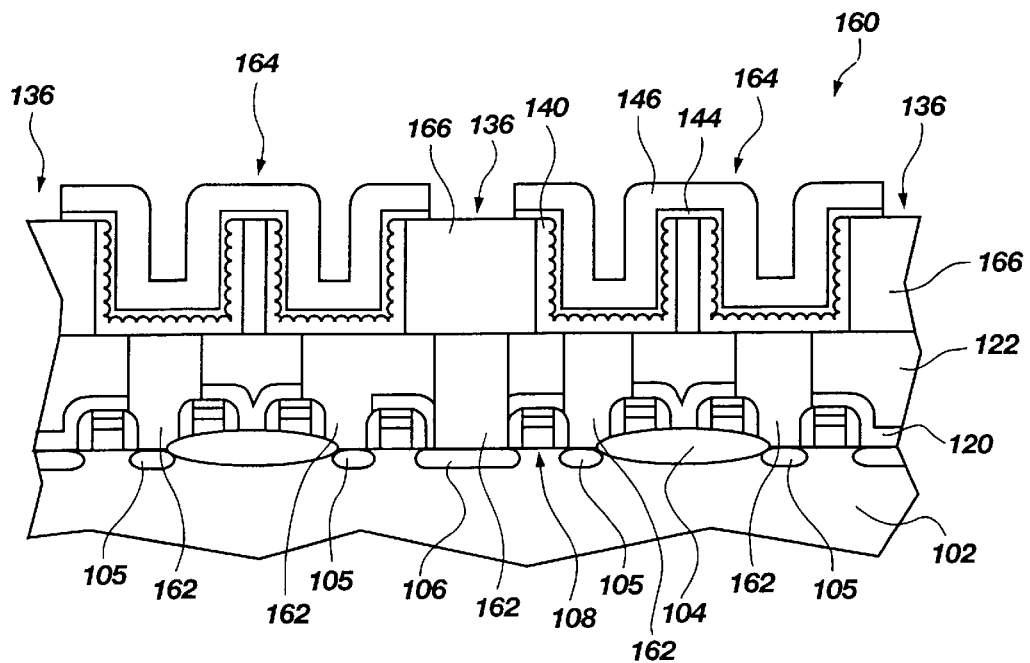
FIG. 34 illustrates an alternate memory cell structure formed according to the present invention.

FIG. 34 illustrates an alternate memory cell structure 160 formed using the teachings of the present invention. The memory cell structure 160 includes conductive plugs 162 which connect the capacitor structures 164 to the drain regions 105 and may also connect the source regions 106 to a bitline to be formed. The formation of the conductive plugs 162 is taught in commonly-owned U.S. Pat. No. 5,338,700 issued Aug. 16, 1994 to Dennison et al., hereby incorporated herein by reference. The conductive plugs 162 are formed in the second barrier layer 122. Additional barrier material 166 is applied over the second barrier layer 122 and the conductive plugs 162, and the technique of the present invention described above is used to pattern the capacitor structure 164 in the additional barrier material 166.

The conductive plugs 162 essentially elevate the formation of the capacitor structure 164 and the subsequently formed bitline to a position above the substrate 102. Forming the conductive plugs 162 results in less dependency on etch selectivity in the formation of the vias in the second barrier layer 122 to form the capacitor structures 164 and/or the bitline. This advantage becomes critical in situations where high aspect ratio (depth of contact to width of contact) contacts are required. As memory cells become smaller and smaller, high aspect ratio contacts are necessary. However with the smaller memory cell size, it becomes increasingly difficult to control the etch selectivity for forming the vias for the higher aspect ratio contacts. Controlling the etch selectivity is critical to prevent shorting between the capacitor structure (as shown in FIG. 32) and the wordline 112 and between the bitline (not shown) and the wordline 112. Thus, the alternate memory cell structure 160 shown in FIG. 34 alleviates this problem.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. A method of producing a memory cell, comprising:

providing an intermediate structure comprising a substrate having at least one thick field oxide area and at least one active area, including at least one implanted drain region and at least one implanted source region, said intermediate structure further including at least one transistor gate member spanned between said at least one drain region and said at least one source region on said at least one substrate active area, and a barrier layer substantially covering said at least one field oxide area, said at least one active area, and said at least one transistor gate member;

patterning a first resist on said barrier layer;

removing said barrier layer in said pattern of said first resist to a predetermined depth to form recesses with corners formed at a step between said recesses and non-removed portions of said barrier layer;

removing said first resist;

depositing a shield layer over said barrier layer;

patterning a second resist on said shield layer;

removing said shield layer in said pattern of said second resist such that a portion of said shield layer under said second resist and a portion of said shield layer in said barrier layer recess corners remain after said shield layer removal;

removing said barrier layer to expose a portion of said at least one transistor gate, member, a portion of said at least one active area, and a portion of said at least one field oxide area;

removing said second resist;

depositing a storage poly layer;

depositing a support material over said storage poly layer prior to the removing said remaining shield layer portions;

removing said remaining shield layer portions;

removing said support material after removing said shield layer portions;

depositing a dielectric layer over said storage poly layer; and depositing a cell poly layer over said dielectric layer.

2. The method of claim 1, wherein said barrier layer comprises a first barrier layer and a second barrier layer adjacent said at least one transistor gate member, said at least one active area, and said at least one field oxide area.

3. The method of claim 2, wherein said first barrier layer includes a material comprising tetraethyl orthosilicate.

4. The method of claim 2, wherein said second barrier layer includes a material comprising a borophosphosilicate glass.

5. The method of claim 1, wherein said shield layer includes a material comprising silicon nitride.

6. A method of producing a memory cell, comprising:

providing an intermediate structure comprising a substrate having at least one thick field oxide area and at least one active area, including at least one implanted drain region and at least one implanted source region, said intermediate structure further including at least one transistor gate member spanned between said at least one drain region and said at least one source region on said at least one substrate active area, a barrier layer substantially covering said at least one field oxide area, said at least one active area, and said at least one transistor gate member, at least one conductive plug extending through said barrier layer to contact said at least one drain region, and an additional barrier layer covering said barrier layer and said at least one conductive plug;

patterning a first resist on said additional barrier layer;

removing said additional barrier layer in said pattern of said first resist to a predetermined depth to form recesses with corners formed at a step between said recesses and non-removed portions of said additional barrier layer;

removing said first resist;

depositing a shield layer over said additional barrier layer;

patterning a second resist on said shield layer;

removing said shield layer in said pattern of said second resist such that a portion of said shield layer under said second resist and a portion of said shield layer in said additional barrier layer recess corners remain after said shield layer removal;

removing said additional barrier layer to expose said at least one conductive plug;

removing said second resist;

depositing a storage poly layer;

depositing a support material over said storage poly layer prior to removing said remaining shield layer portions;

removing said remaining shield layer portions;

removing said support material after removing said shield layer portions;

depositing a dielectric layer over said storage poly layer; and depositing a cell poly layer over said dielectric layer.

7. The method of claim 6, wherein said barrier layer comprises a first barrier layer and a second barrier layer adjacent said at least one transistor gate member, said at least one active area, and said at least one field oxide area.

8. The method of claim 7, wherein said first barrier layer includes a material comprising tetraethyl orthosilicate.

9. The method of claim 7, wherein said second barrier layer includes a material comprising a borophosphosilicate glass.

10. The method of claim 6, wherein said shield layer includes a material comprising silicon nitride.

* * * * *

UNITED STATES PATENT AND TRADEMARK OFFICE
CERTIFICATE OF CORRECTION

PATENT NO : 6,063,656
DATED : May 16, 2000
INVENTOR(S) : Darwin A. Clampitt

It is certified that error appears in the above-identified patent and that said Letters Patent is hereby corrected as shown below:

Column 3, line 26, after "invention;" insert --and--;

Column 4, line 20, change "protects" to --protected--;

Column 5, line 25, after "resist" insert --layer--;

Column 5, line 29, change "A-A" to --19-19--;

Column 5, line 30, change "B-B" to --19-19--;

Column 6, line 56, after "include" insert --,--;

Column 6, line 57, after "to" insert --,--;

Column 7, line 16, after "However" insert --,--;

Claim 1, Column 7, line 55, change "comers" to --corners--; and

Claim 1, Column 7, line 58, after "gate" delete ",".

Signed and Sealed this

Tenth Day of April, 2001

Attest:

NICHOLAS P. GODICI

*Attesting Officer*   *Acting Director of the United States Patent and Trademark Office*